United States Patent
Chung et al.

(10) Patent No.: US 8,664,719 B2
(45) Date of Patent: Mar. 4, 2014

(54) HIGH VOLTAGE DEVICE WITH REDUCED LEAKAGE

(71) Applicant: Taiwan Semiconductor Manufacturing Company, Ltd., Hsin-Chu (TW)

(72) Inventors: Shu-Wei Vanessa Chung, Taichung (TW); Kuo-Feng Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/735,831

(22) Filed: Jan. 7, 2013

(65) Prior Publication Data

US 2013/0119466 A1      May 16, 2013

Related U.S. Application Data

(63) Continuation of application No. 12/549,540, filed on Aug. 28, 2009, now Pat. No. 8,350,327.

(60) Provisional application No. 61/092,993, filed on Aug. 29, 2008.

(51) Int. Cl.
    *H01L 29/78* (2006.01)
(52) U.S. Cl.
    USPC .... 257/343; 257/344; 257/345; 257/E29.255; 257/E29.256

(58) Field of Classification Search
    USPC .......... 257/343–345, 408, E29.255, E29.256, 257/E29.258, E29.266, E21.417
    See application file for complete search history.

(56) References Cited

U.S. PATENT DOCUMENTS

| 7,211,846 B2 | 5/2007 | Tihanyi |
| 7,304,348 B2 * | 12/2007 | Ehwald et al. ................ 257/335 |
| 2005/0275037 A1 | 12/2005 | Chung |

OTHER PUBLICATIONS

K.E. Ehwald, et al., "High Performance RF LDMOS Transistors with 5nm Gate Oxide in a 0.25 μm SiGe:C BiCMOS Technology", 2001 IEEE—IEDM 01-895-898, pp. 40.4.1-40.4.4, Germany.

* cited by examiner

*Primary Examiner* — Zandra Smith
*Assistant Examiner* — Paul Patton
(74) *Attorney, Agent, or Firm* — Haynes and Boone, LLP

(57) ABSTRACT

A semiconductor device is provided which includes a semiconductor substrate, a gate structure formed on the substrate, sidewall spacers formed on each side of the gate structure, a source and a drain formed in the substrate on either side of the gate structure, the source and drain having a first type of conductivity, a lightly doped region formed in the substrate and aligned with a side of the gate structure, the lightly doped region having the first type of conductivity, and a barrier region formed in the substrate and adjacent the drain. The barrier region is formed by doping a dopant of a second type of conductivity different from the first type of conductivity.

20 Claims, 13 Drawing Sheets

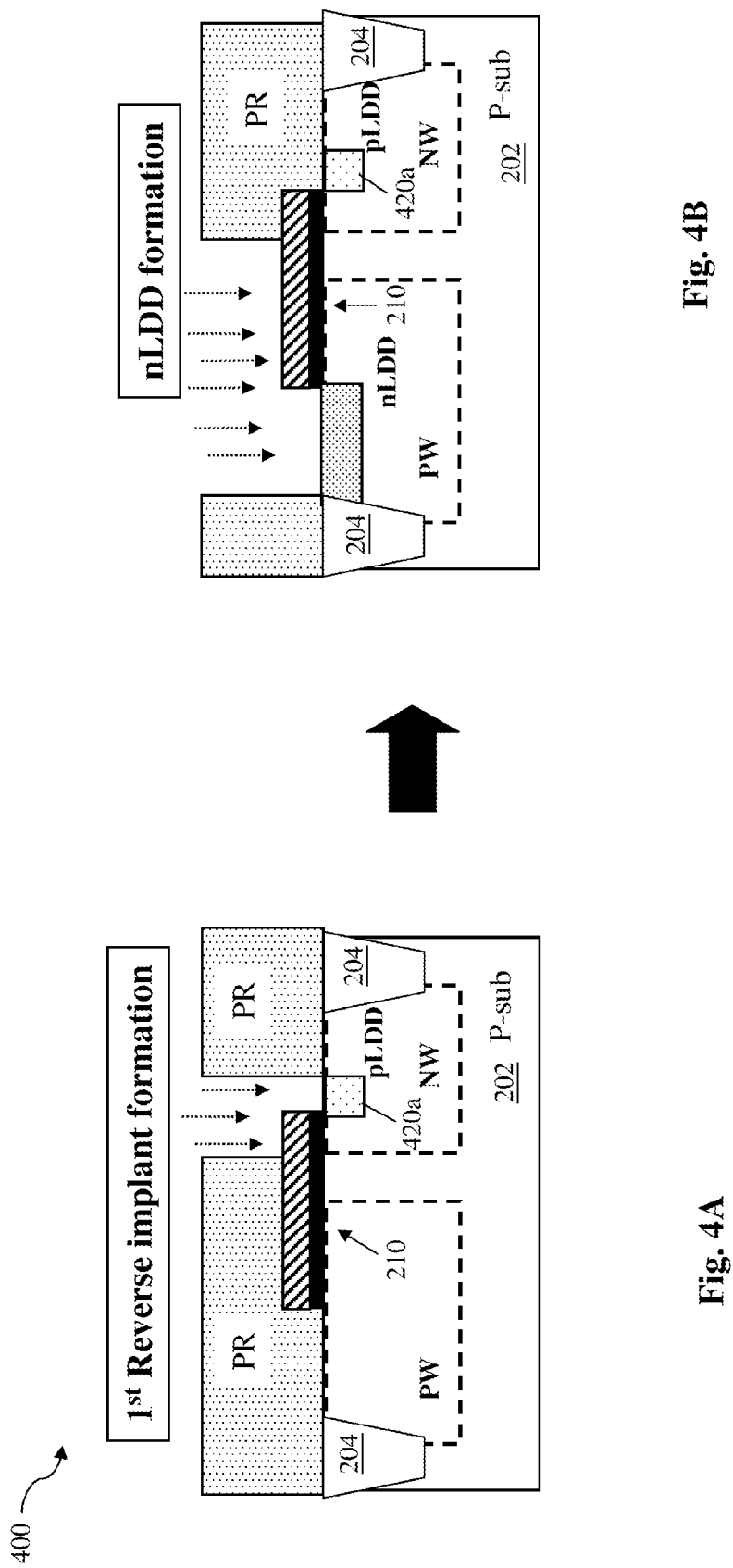

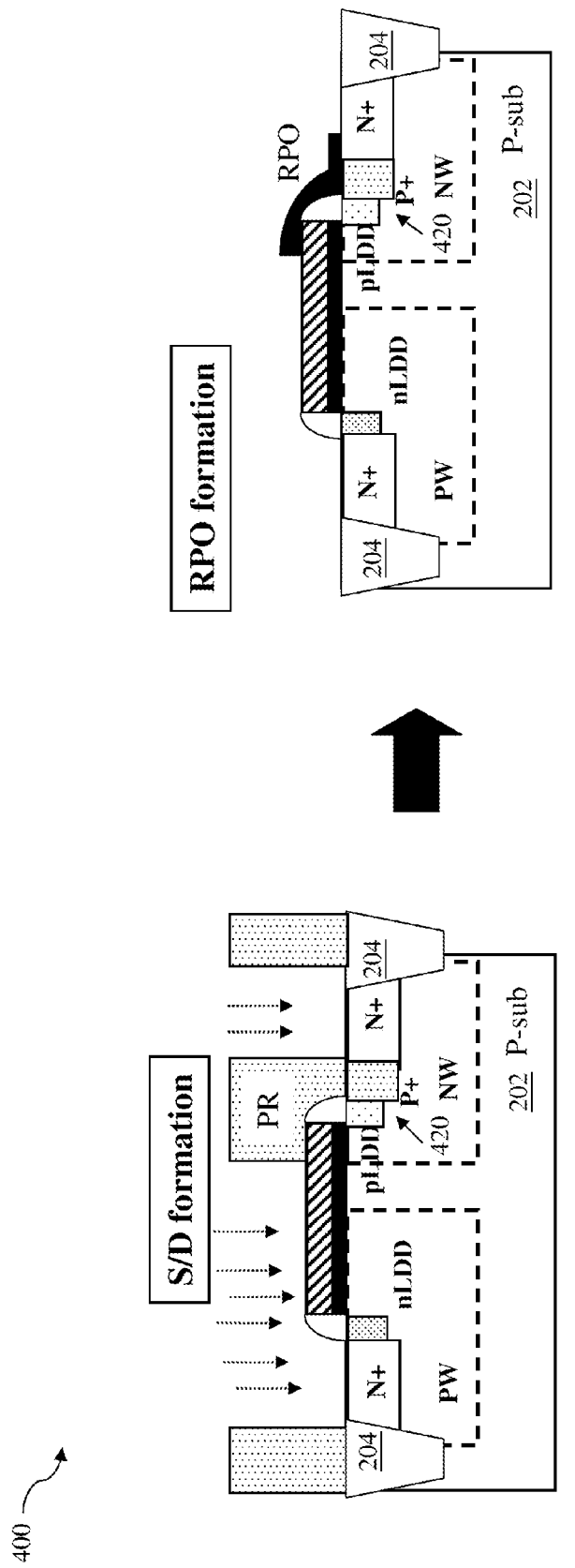

HIGH VOLTAGE DEVICE WITH REDUCED LEAKAGE

PRIORITY DATA

The present application is a continuation application of U.S. patent application Ser. No. 12/549,540, filed Aug. 28, 2009, which claims priority to Provisional Application Ser. No. 61/092,993 filed on Aug. 29, 2008, entitled "High Voltage Device With Reduced Leakage," each of which is hereby incorporated by reference in its entirety.

BACKGROUND

The present disclosure relates generally to semiconductor technology, and more particularly, to a high voltage device with reduced leakage and method of making the same.

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

As semiconductor circuits composed of devices such as metal-oxide-semiconductor field effect transistors (MOSFETs) are adapted for high voltage applications, problems arise with respect to incorporating a high voltage device with a low voltage device (e.g., a logic device) for a system on chip (SoC) technology. For example, as the scaling down of logic device continues with advanced technologies (e.g., 45 nm and below), the process flow may be accompanied with high implantation concentration to prevent punch-through between source and drain or to reduce resistance of source and drain, and thus may cause high leakage problems and the degradation of device reliability.

Therefore, what is needed is a reliable high voltage device with reduced leakage and method of making the same.

SUMMARY

One of the broader forms of an embodiment of the present invention involves a semiconductor device. The semiconductor device includes a semiconductor substrate; a gate structure formed on the substrate; sidewall spacers formed on each side of the gate structure; a source and a drain formed in the substrate on either side of the gate structure, the source and drain having a first type of conductivity; a lightly doped region formed in the substrate and aligned with a sidewall of the gate structure, the lightly doped region having the first type of conductivity; and a barrier region formed in the substrate and adjacent the drain. The barrier region is formed by doping a dopant of a second type of conductivity different from the first type of conductivity. In some embodiments, the first type of conductivity includes p-type and the second type of conductivity includes n-type. In other embodiments, the first type of conductivity includes n-type and the second type of conductivity includes p-type.

Another one of the broader forms of an embodiment of the present invention involves a method for fabricating a semiconductor device. The method includes providing a semiconductor substrate; forming a first well in the substrate, the first well having a first type of conductivity; forming a second well in the substrate, the second well having a second type of conductivity different from the first type of conductivity; forming a gate structure on the substrate, the gate structure having a first portion overlying the first well and a second portion overlying the second well; forming a barrier region in the first well, the barrier region being formed by doping a dopant of the second type of conductivity; and forming a source in the second well and a drain in the first well, the source and drain having the first type of conductivity, the drain being adjacent the barrier region.

Yet another one of the broader forms of an embodiment of the present invention involves a semiconductor device. The semiconductor device includes a semiconductor substrate; a first well of a first type of conductivity disposed in the substrate; a second well of a second type of conductivity disposed in the substrate; a gate structure disposed on the substrate, the gate structure having a first portion overlying the first well and a second portion overlying the second well; a source of the first type of conductivity disposed in the second well; a drain of the first type of conductivity disposed in the first well; and a barrier region disposed in the first well and adjacent the drain, the barrier region being formed by doping impurities of the second type of conductivity.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 4A to 4F are cross-sectional views of another alternative embodiment of a semiconductor device at various stages of fabrication according to various aspects of the present disclosure.

DETAILED DESCRIPTION

Figure 1:
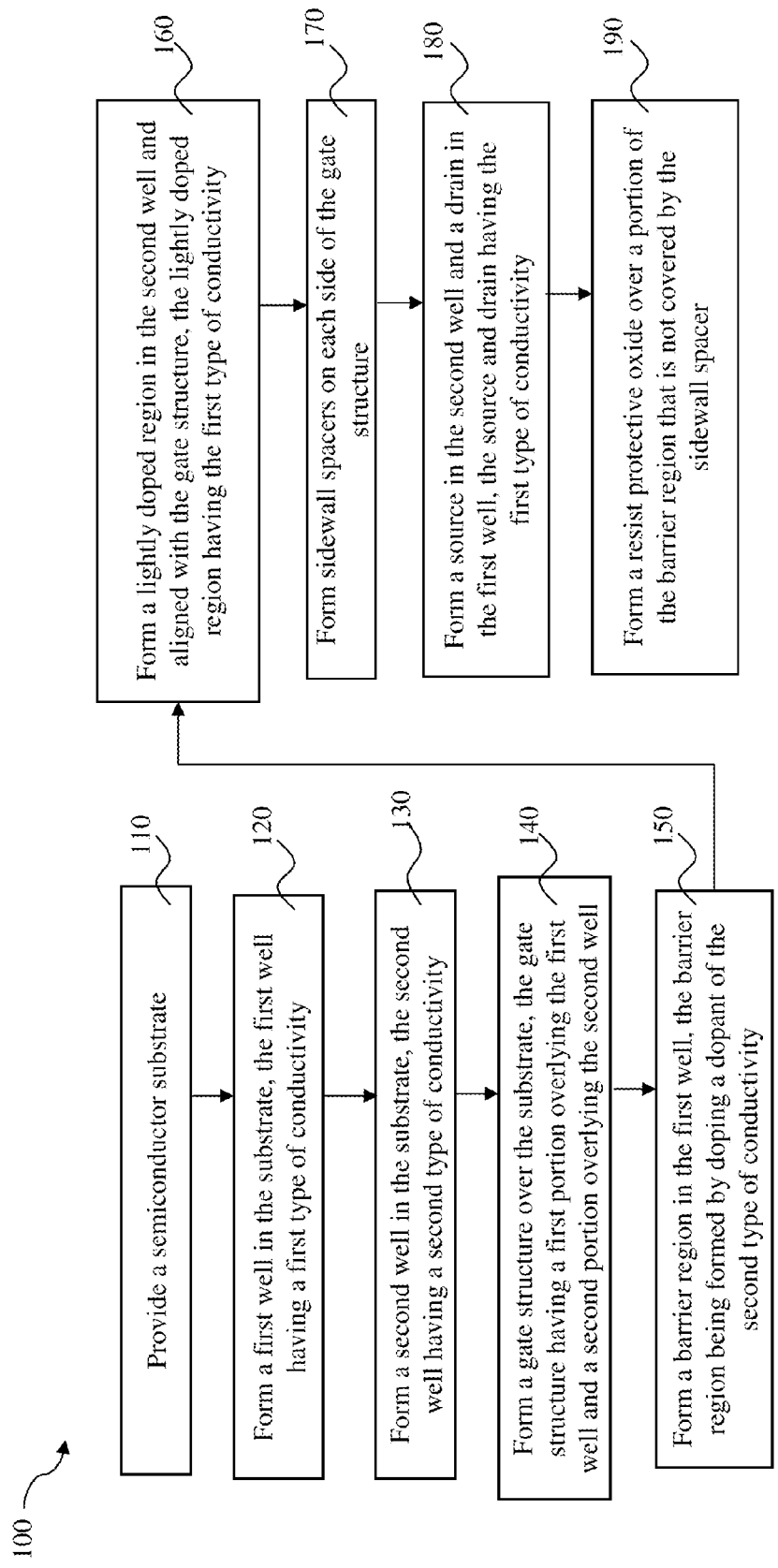
FIG. 1 is a flowchart of a method for fabricating a semiconductor device according to various aspects of the present disclosure.

The present disclosure relates generally to the field of semiconductor integrated circuits. It is understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIG. 1 is a flowchart of a method 100 for fabricating a semiconductor device according to various aspects of the present disclosure. FIGS. 2A to 2I are cross-sectional views of a semiconductor device 200 at various stage of fabrication according to the method 100 of FIG. 1. It should be noted the method 100 may be implemented in a complementary metal oxide semiconductor (CMOS) technology process flow. Accordingly, it is understood that additional processes be provided before, during, and after the method 100, and some processes may only be briefly described herein. Further, FIGS. 2A to 2I may be simplified for a better understanding of the disclosed embodiment, and that the semiconductor device 200 may be configured as a system on chip (SoC) having p-type MOS (PMOS) and n-type MOS (NMOS) devices that are formed concurrently in other active regions of the semiconductor device. These PMOS and NMOS devices, functioning in low voltage range, may work in a logic circuit or memory circuit of the SoC. Otherwise, based on method 100 and similar device structure with semiconductor device 200, complementary high voltage MOS (HVMOS), i.e., n-type and p-type HVMOS (nHVMOS and pHVMOS), may be formed on the same chip.

Figure 5B:
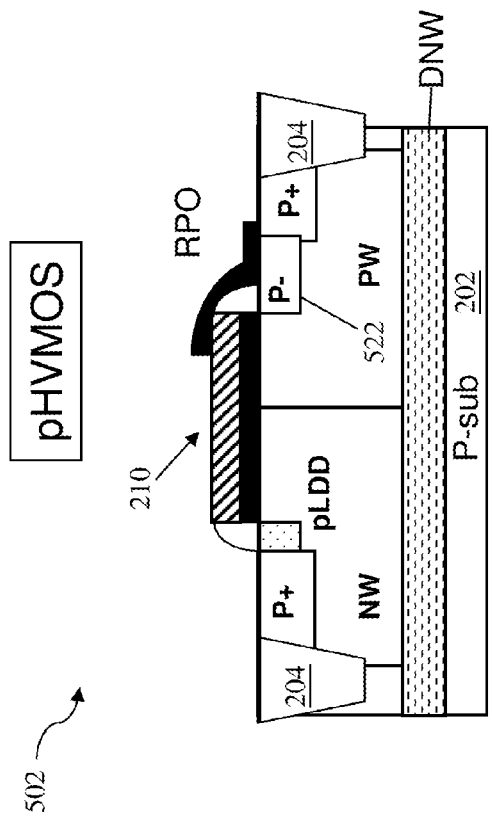
FIGS. 5A and 5B are cross-sectional views of yet another alternative embodiment of an n-type and p-type semiconductor device, respectively, according to various aspects of the present disclosure.

The method 100 begins with block 110 in which a semiconductor substrate is provided. In FIG. 2A, the substrate may include a semiconductor wafer such as a silicon wafer. Alternatively, the substrate may include other elementary semiconductors such as germanium. The substrate may also include a compound semiconductor such as silicon carbide, gallium arsenic, indium arsenide, and indium phosphide. The substrate may include an alloy semiconductor such as silicon germanium, silicon germanium carbide, gallium arsenic phosphide, and gallium indium phosphide. In one embodiment, the substrate includes an epitaxial layer (epi layer) overlying a bulk semiconductor. Furthermore, the substrate may include a semiconductor-on-insulator (SOI) structure. For example, the substrate may include a buried oxide (BOX) layer formed by a process such as separation by implanted oxygen (SIMOX). In various embodiments, the substrate may include a buried layer such as an n-type buried layer (NBL), a p-type buried layer (PBL), and/or a buried dielectric layer including a buried oxide (BOX) layer. In the present embodiment, illustrated by n-type HVMOS, the substrate includes a p-type silicon substrate (p-substrate) 202. To form a complementary HVMOS, an n-type buried layer, i.e., deep n-well (DNW), may be implanted deeply under the active region of the p-type HVMOS of the p-substrate (as shown in FIG. 5B).

An isolation feature structure 204 such as a shallow trench isolation (STI) or local oxidation of silicon (LOCOS) including the isolation feature may be formed in the substrate to define and electrically isolate various active regions. As one example, the formation of an STI feature may include dry etching a trench in a substrate and filling the trench with insulator materials such as silicon oxide, silicon nitride, or silicon oxynitride. The filled trench may have a multi-layer structure such as a thermal oxide liner layer filled with silicon nitride or silicon oxide. In furtherance of the embodiment, the STI structure may be created using a processing sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical polishing (CMP) processing to etch back and planarize, and using a nitride stripping process to remove the silicon nitride.

Figure 2B:
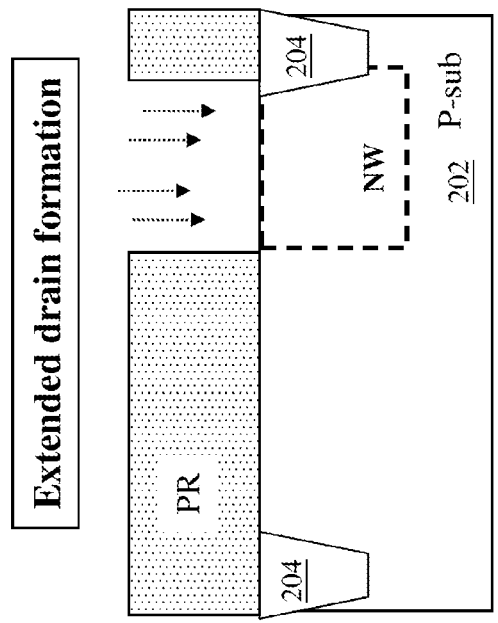
FIGS. 2A to 2I are cross-sectional views a semiconductor device at various stages of fabrication according to the method of FIG. 1.
Figure 2A:
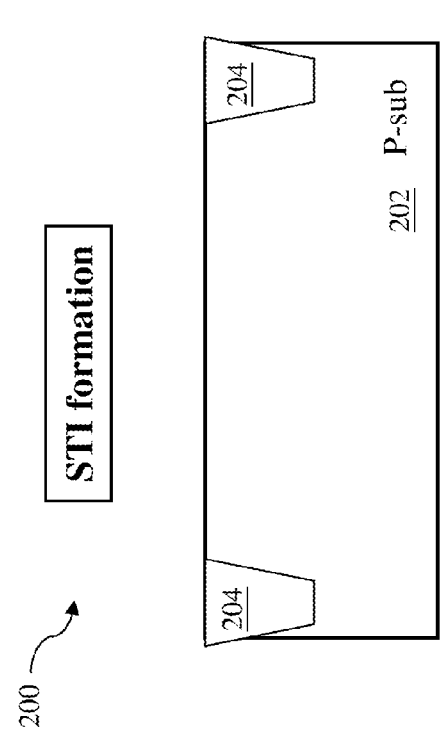

In FIG. 2B, the method 100 continues with block 120 in which a first well is formed in the substrate, the first well having a first type of conductivity. For example, the first type of conductivity is an n-type. An N-well (NW) may be formed in the p-substrate 202 adjacent to the isolation structure 204. The N-well may be referred to an extended drain or drain extension well. In FIG. 2C, the method 100 continues with block 130 in which a second well may be formed in the substrate, the second well having a second type of conductivity different from the first type of conductivity. For example, the second type of conductivity is a p-type. A P-well (PW) may be formed in the p-substrate 202 adjacent to the isolation structure 204. The N-well and the P-well may be a portion of the substrate, and may formed by various ion implantation processes. Alternatively, the N-well and the P-well may be portions of an epitaxy layer such as a silicon epitaxy layer formed by epitaxy processing. The N-well may have an n-type dopant such as phosphorus, and the P-well may have a p-type dopant such as boron. In one embodiment, the N-well and P-well may be formed by a plurality of processing steps, whether now known or to be developed, such as growing a sacrificial oxide on substrate, opening a pattern for the location(s) of the P-well regions or N-well region, and implanting the impurities.

Figure 2D:
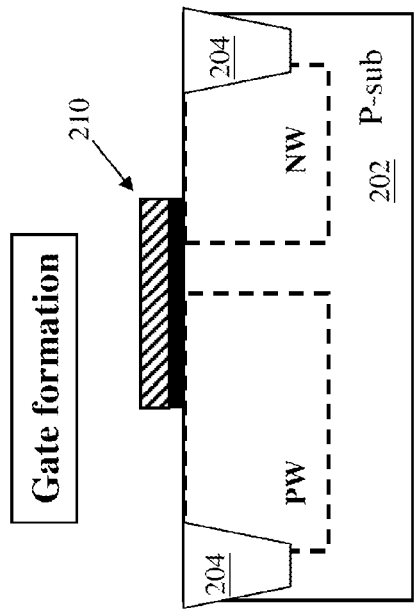
Figure 2C:
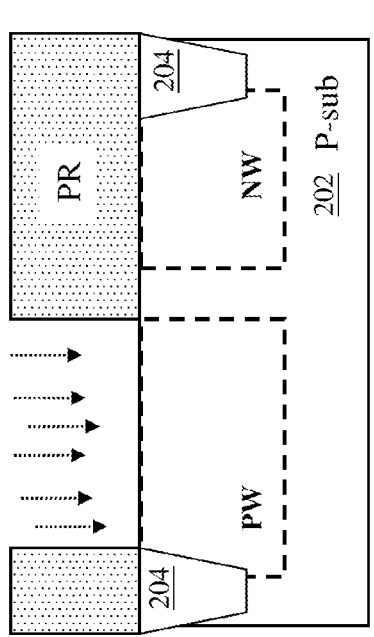

In FIG. 2D, the method 100 continues with block 140 in which a gate structure is formed on the substrate, the gate structure having a first portion overlying the first well and a second portion overlying the second well. A gate structure 210 may be disposed on the substrate, including a gate dielectric formed on the substrate, and a gate electrode formed on the gate dielectric. The gate dielectric may include a silicon dioxide (referred to as silicon oxide) layer. Alternatively, the gate dielectric may optionally include a high-k dielectric material, silicon oxynitride, other suitable materials, or combinations thereof. The high-k material may be selected from metal oxides, metal nitrides, metal silicates, transition metal-oxides, transition metal-nitrides, transition metal-silicates, oxynitrides of metals, metal aluminates, zirconium silicate, zirconium aluminate, HfO2, or combinations thereof. The gate dielectric may have a multilayer structure such as one layer of silicon oxide and another layer of high k material. The gate dielectric layer may have a thickness ranging between about 10 Angstroms and about 200 Angstroms. The gate dielectric may be formed using chemical vapor deposition (CVD), physical vapor deposition (PVD), atomic layer deposition (ALD), thermal oxide, other suitable processes, or combinations thereof.

The gate electrode may be configured to be coupled to metal interconnects and may be disposed overlying the gate dielectric. The gate electrode may include a doped or non-doped polycrystalline silicon (or polysilicon). Alternatively, the gate electrode layer may include a metal such as Al, Cu, W, Ti, Ta, TiN, TaN, NiSi, CoSi, other suitable conductive materials, or combinations thereof. The gate electrode layer may be formed by CVD, PVD, ALD, plating, and other proper processes. The gate electrode layer may have a multi-layer structure and may be formed in a multiple-step process.

The gate dielectric layer and the gate electrode layer formed on the substrate are then patterned to form a plurality of gate stacks using a process including photolithography patterning and etching. One exemplary method for patterning the gate dielectric and electrode layers is described below. A layer of photoresist is formed on the polysislicon layer by a suitable process, such as spin-on coating, and then patterned to form a patterned photoresist feature by a proper lithography patterning method. The pattern of the photoresist can then be transferred by a dry etching process to the underlying polysilicon layer and the gate dielectric layer to form gate electrodes and gate dielectric, in a plurality of processing steps and various proper sequences. The photoresist layer may be stripped thereafter. In another embodiment, only the gate electrode layer is pattered. In another embodiment, a hard mask layer may be used and formed on the polysilicon layer. The patterned photoresist layer is formed on the hard mask layer. The pattern of the photoresist layer is transferred to the hard mask layer and then transferred to the polysilicon layer to form the gate electrode. The hard mask layer may include silicon nitride, silicon oxynitride, silicon carbide, and/or other suitable dielectric materials, and may be formed using a method such as CVD or PVD.

Figures 2E, 2F:
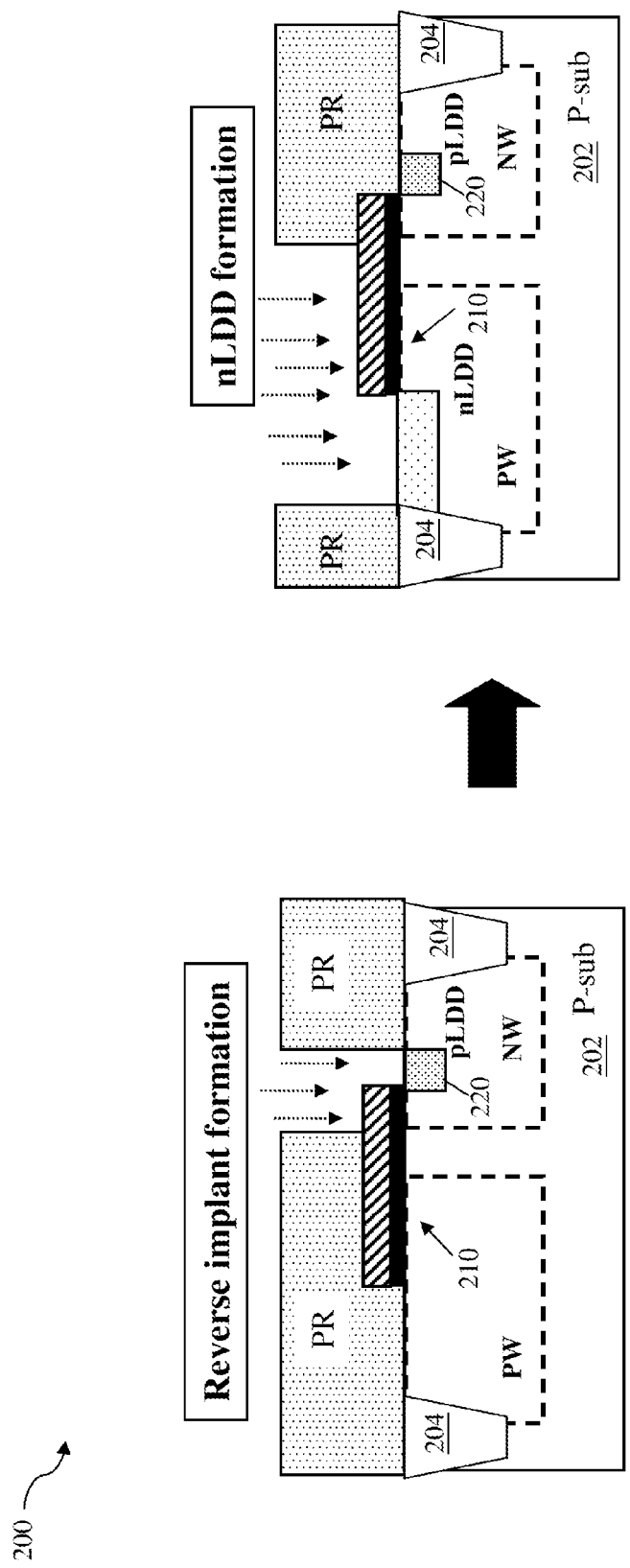

In FIG. 2E, the method 100 continues with block 150 in which a barrier region is formed in the first well, the barrier region being formed by doping a dopant of the second type of conductivity. The barrier region may be formed by a counter doping or reverse implantation process. As previously noted, the semiconductor device 200 may be include various n-type MOS (NMOS) and p-type MOS (PMOS) devices formed in other active regions of the substrate 202. Accordingly, a barrier region 220 may be formed locally and concurrently (same stage) with formation of lightly doped drain regions of a p-type (referred to as pLDD) in the other active regions of the substrate for the PMOS devices. Accordingly, the barrier region 220 may be formed without requiring an extra photomask for patterning and/or implantation process. A portion of the semiconductor device 200 may be protected by a patterned photoresist. A portion of the N-well may be exposed for forming the barrier region 220. The barrier region 220 may have an edge substantially self-aligned to an edge of the gate structure 210. In an embodiment, the implantation process may include a p-type dopant that includes In, $BF_2$ or B, an energy ranging from about 1 to about 60 KeV or from about 2 to about 30 KeV, a dosage ranging from about 1E13 to about 1E16 atoms/cm$^2$, and a tilt ranging from 0 to about 45 degree. The p-type barrier region may include a doping concentration ranging from about 1E19 to about 1E24 atoms/cm$^3$.

Alternatively, the barrier region may include an n-type for a reverse configuration (all doping type being reversed) of the high voltage device. Accordingly, the n-type barrier region may be formed in a P-well by an ion implantation process. In an embodiment, the implantation process may include a n-type dopant that includes P or As, an energy ranging from about 1 to about 60 KeV or from about 2 to about 30 KeV, a dosage ranging from about 1E13 to about 1E16 atoms/cm$^2$, and a tilt ranging from 0 to about 45 degree. The n-type barrier region may include a doping concentration ranging from about 1E19 to about 1E24 atoms/cm$^3$.

In FIG. 2F, the method 100 continues with block 160 in which a lightly doped region is formed in the second well and aligned with the gate structure, the lightly doped region having the first type of conductivity. A lightly doped source region of an n-type (referred to as nLDD region) may be formed in the P-well. The nLDD region may be laterally positioned on a sidewall of the gate structure 210. As previously noted, the chip of semiconductor device 200 may include its reverse type HVMOS and various NMOS and PMOS devices formed in other active regions of the same chip. Accordingly, the lightly doped source region may be formed concurrently (same stage) with formation of lightly doped drain regions of an n-type (nLDD) in the other active regions of the substrate for the NMOS devices. The nLDD region may have an edge substantially self-aligned to an edge of the gate structure 210. The nLDD region may include n-type dopant such as phosphorus or arsenic. The nLDD regions are formed by a method including ion implantation or diffusion. It should be noted that the barrier region including 220 the N-well may be protected with a patterned photoresist layer during this process.

Figures 2G, 2H:
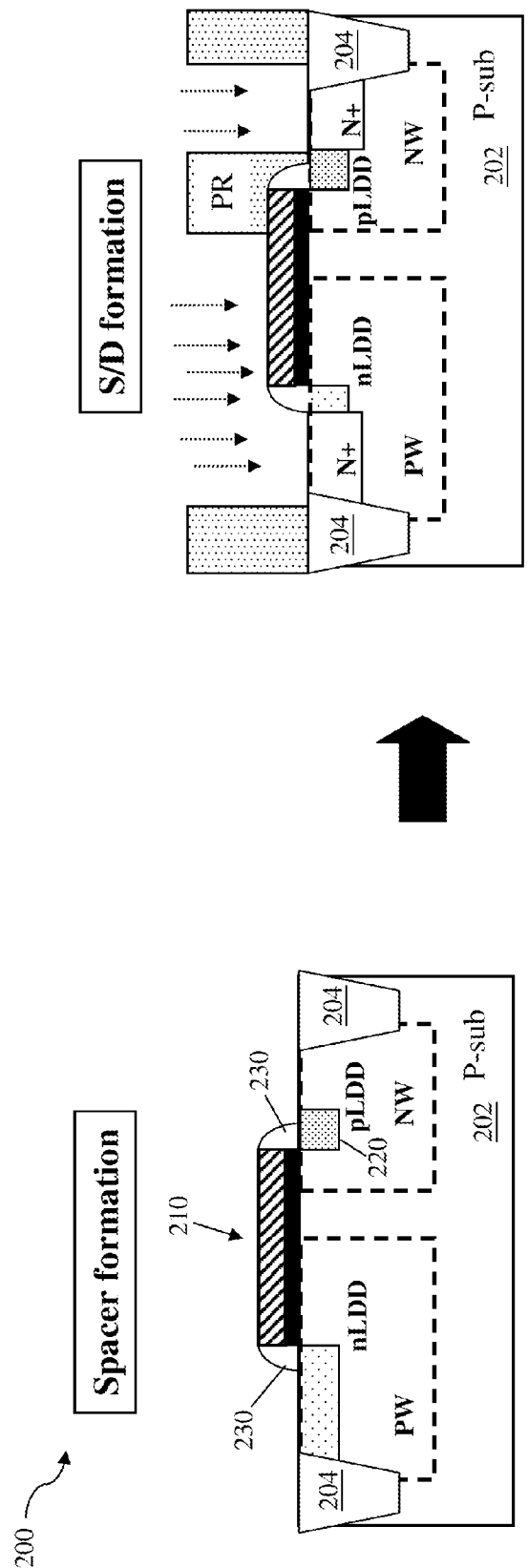

In FIG. 2G, the method 100 continues with block 170 in which sidewall spacers are formed on each side of the gate structure. Sidewall spacers 230 may be formed on both sidewalls of the gate structure 210. The sidewall spacers 230 may include a dielectric material such as silicon oxide. Alternatively, the sidewall spacers 230 may optionally include silicon nitride, silicon carbide, silicon oxynitride, or combinations thereof. In some embodiments, the sidewall spacers 230 may have a multilayer structure. The sidewall spacers 230 may be formed by a deposition and etching (anisotropic etching technique) as is known in the art.

In FIG. 2H, the method 100 with block 180 in which a source is formed in the second well and a drain may be formed in the first well, the source and drain having the first type of conductivity. A process to form source/drain of an n-type (referred to as N+ or heavily doped region) may be performed for the NMOS devices. The source and drain may be positioned on both sides of the gate structure and interposed thereby. The source may include an edge substantially self-aligned to one of the sidewall spacers. However, the drain may include an edge that is adjacent to the barrier region. Accordingly, a patterned photoresist layer may protect a portion of the barrier region that extends beyond an outer edge of the other one of the sidewall spacers. In the present embodiment, the source and drain regions include N-type dopant such as P or As. The source and drain may be formed by a method such as ion implantation or diffusion. A rapid thermal annealing (RTA) process may be used to activate the implanted dopant. In various embodiments, the source and drain regions may have different doping profiles formed by multi-process implantation. It should be noted that a process to form source/drain of a p-type (referred to as P+ or heavily doped region) may be performed for the PMOS devices in the other active regions of the substrate. Accordingly, the NMOS devices including the present embodiment may be protected by a patterned photoresist layer.

Figure 2I:
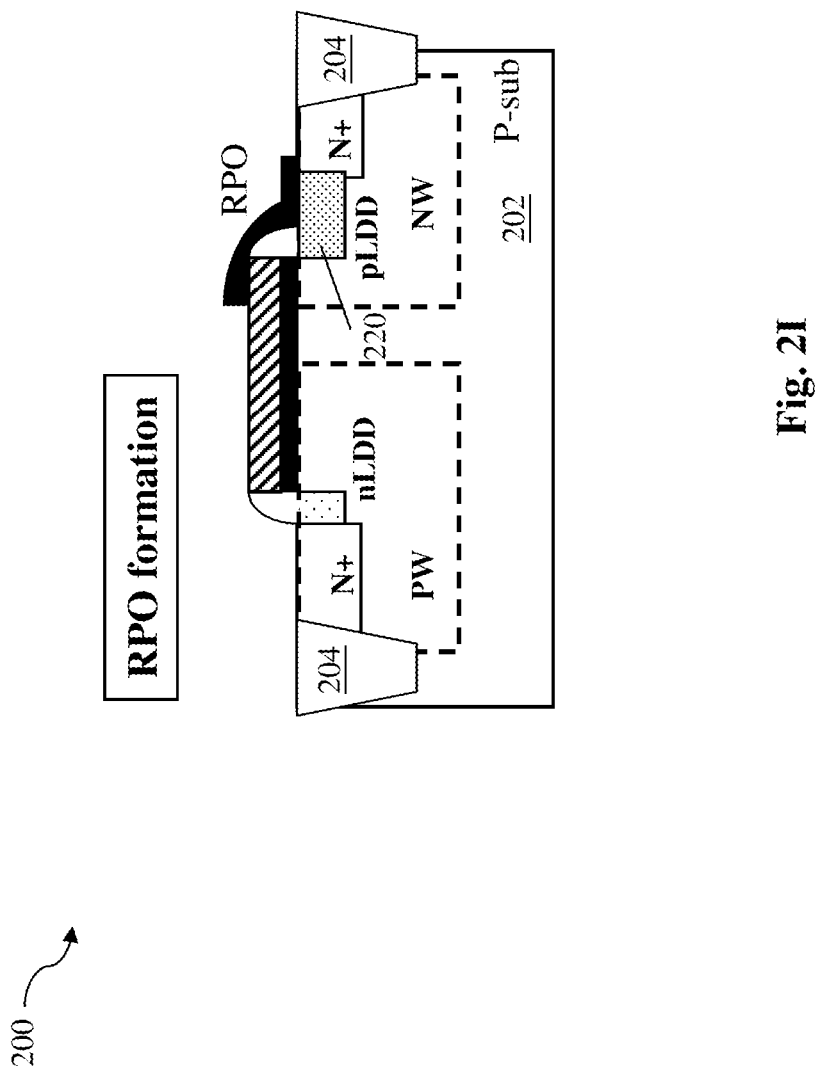

In FIG. 2I, the method 100 continues with block 190 in which a resist protective oxide (RPO) is formed over a portion of the barrier region that is not protected by the sidewall spacer. The RPO may function as a silicide blocking layer during a subsequent salicide process discussed below. Further, since the barrier region 220 may have a length (from the gate edge) close to or larger than 0.1 um, the RPO may be needed to prevent the formation of a thyresistor transistor. Alternatively, the barrier region may be protected by forming another spacer at the drain side to cover barrier region. It should be noted that if the barrier region does not have to be so large according to a particular application product, the solely spacer protection approach may avoid undesired process variations and may result in the pitch of the device being smaller as compared to the RPO approach.

It is understood that the semiconductor device may undergo further CMOS processing as is known in the art. For example, the semiconductor device may further include forming various contacts and metal features on the substrate. Silicide features may be formed by silicidation such as self-aligned silicide (salicide) in which a metal material is formed next to Si structure, then the temperature is raised to anneal and cause reaction between underlying silicon and the metal to form silicide, and un-reacted metal is etched away. The salicide material may be self-aligned to be formed on various features such as the source region, drain region and/or gate electrode to reduce contact resistance.

Also, a plurality of patterned dielectric layers and conductive layers are formed on the substrate to form multilayer interconnects configured to couple the various p-type and n-type doped regions, such as the source, drain region, contact region, and gate electrode. In one embodiment, an interlayer dielectric (ILD) and a multilayer interconnect (MLI) structure are formed in a configuration such that the ILD separates and isolates each metal layer from other of metal layers. In furtherance of the example, the MLI structure includes contacts, vias and metal lines formed on the substrate. In one example, the MLI structure may include conductive materials such as aluminum, aluminum/silicon/copper alloy, titanium, titanium nitride, tungsten, polysilicon, metal silicide, or combinations thereof, being referred to as aluminum interconnects. Aluminum interconnects may be formed by a process including physical vapor deposition (or sputtering), chemical vapor deposition (CVD), or combinations thereof. Other manufacturing techniques to form the aluminum interconnect may include photolithography processing and etching to pattern the conductive materials for vertical connection (via and contact) and horizontal connection (conductive line). Alternatively, a copper multilayer interconnect may be used to form the metal patterns. The copper interconnect structure may include copper, copper alloy, titanium, titanium nitride, tantalum, tantalum nitride, tungsten, polysilicon, metal silicide, or combinations thereof. The copper interconnect may be formed by a technique including CVD, sputtering, plating, or other suitable processes.

The ILD material includes silicon oxide. Alternatively or additionally, the ILD includes a material having a low dielectric constant such as a dielectric constant less than about 3.5. In one embodiment, the dielectric layer includes silicon dioxide, silicon nitride, silicon oxynitride, polyimide, spin-on glass (SOG), fluoride-doped silicate glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other suitable materials. The dielectric layer may be formed by a technique including spin-on, CVD, or other suitable processes.

MLI and ILD structure may be formed in an integrated process such as a damascene process. In a damascene process, a metal such as copper is used as conductive material for interconnection. Another metal or metal alloy may be additionally or alternatively used for various conductive features. Accordingly, silicon oxide, fluorinated silica glass, or low dielectric constant (k) materials can be used for ILD. During the damascene process, a trench is formed in a dielectric layer, and copper is filled in the trench. Chemical mechanical polishing (CMP) technique is implemented afterward to etch back and planarize the substrate surface.

Figures 3A, 3B:
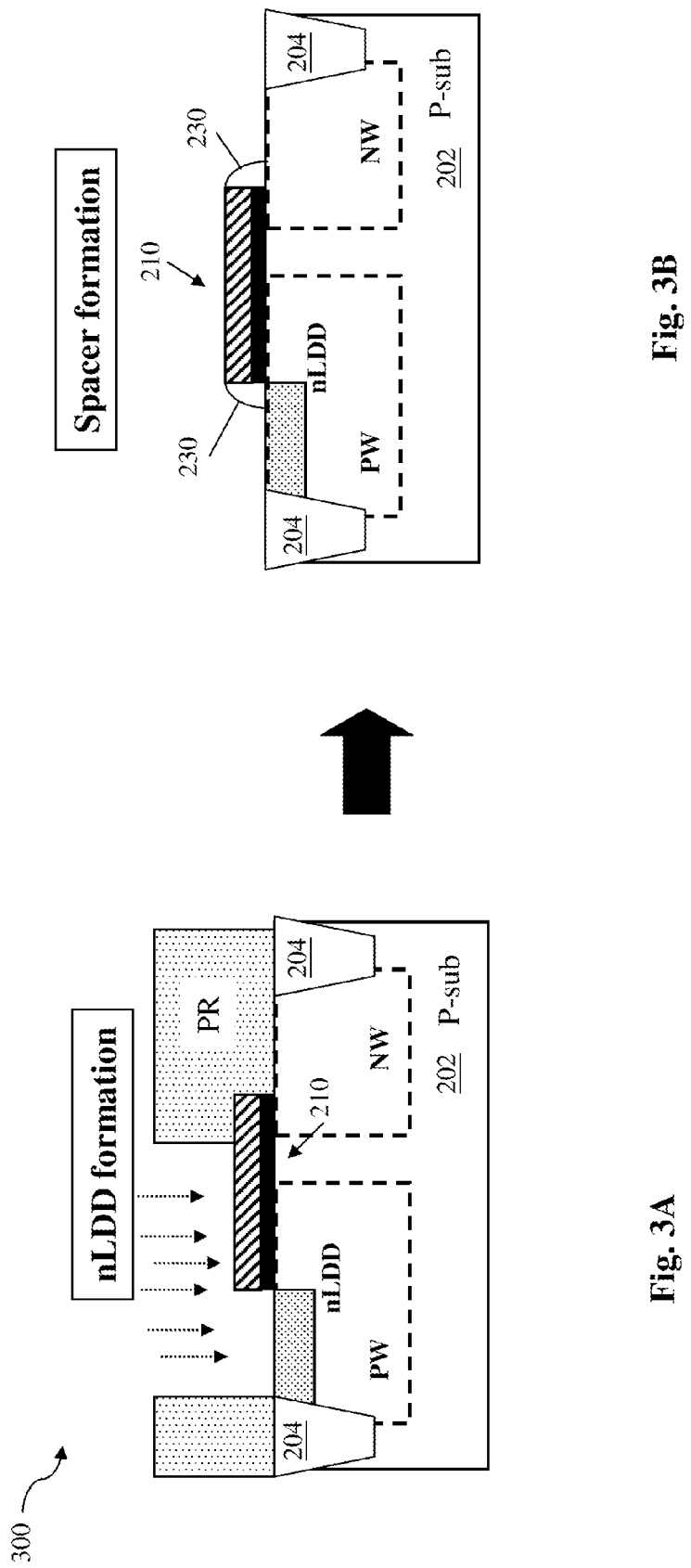
FIGS. 3A to 3E are cross-sectional views of alternative embodiment of a semiconductor device at various stages of fabrication according to various aspects of the present disclosure.

Referring to FIGS. 3A to 3E, illustrated are cross-sectional views of an alternative semiconductor device 300 accordingly to various aspects of the present disclosure. The semiconductor 300 is similar to the semiconductor device 200 of FIG. 2 except that a barrier region 320 may be formed during formation of the source/drain (S/D). Also, the semiconductor device 300 may be fabricated with a similar method that was used to fabricate the semiconductor device 200 of FIG. 2. Accordingly, similar features in FIGS. 2 and 3 are numbered the same for the sake of clarity and simplicity. In FIG. 3A, the semiconductor device 300 is shown following the formation of the gate structure 210 as was discussed in FIGS. 2A to 2D.

In FIG. 3A, a lightly doped source region of an n-type (referred to as nLDD region) may be formed in the P-well. The nLDD region may be laterally positioned on a sidewall of the gate structure 210. As previously noted, the chip of semiconductor device 300 may include its reverse type semiconductor device and various NMOS and PMOS devices formed in other active regions of the same chip. Accordingly, the lightly doped source region may be formed concurrently (same stage) with formation of lightly doped drain regions of an n-type (nLDD) in the other active regions of the substrate for the NMOS devices. The nLDD region may have an edge substantially self-aligned to an edge of the gate structure 210. The nLDD region may include n-type dopant such as phosphorus or arsenic. The nLDD regions are formed by a method including ion implantation or diffusion. It is understood that a process to form pLDD regions in other active regions of the substrate for PMOS devices may be performed. Accordingly, the NMOS devices including the present embodiment may be protected by a patterned photoresist layer.

In FIG. 3B, sidewall spacers 230 may be formed on both sidewalls of the gate structure 210. The sidewall spacers 230 may include a dielectric material such as silicon oxide. Alternatively, the sidewall spacers 230 may optionally include silicon nitride, silicon carbide, silicon oxynitride, or combinations thereof. In some embodiments, the sidewall spacers 230 may have a multilayer structure. The sidewall spacers 230 may be formed by a deposition and etching (anisotropic etching technique) as is known in the art.

Figures 3C, 3D:
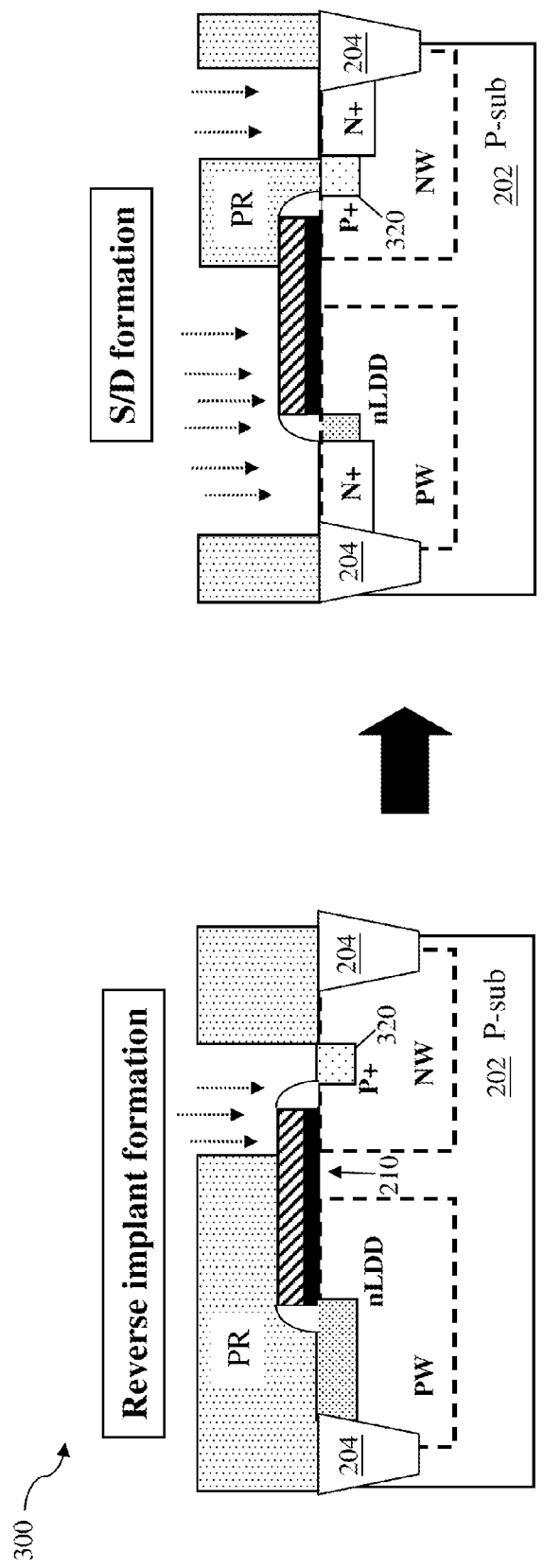

In FIG. 3C, a barrier region of a p-type is formed in the N-well. The barrier region 320 may be formed by a counter doping or reverse implantation process. The chip of the semiconductor device 300 may include its reverse type semiconductor device and various NMOS and PMOS devices formed in other active regions of the substrate. Accordingly, the barrier region 320 may be formed locally and concurrently (same stage) with formation of source and drain (S/D) of a p-type (referred to as P+ or heavily doped region) in the other active regions of the substrate for the PMOS devices. Accordingly, the barrier region 320 may be formed without requiring an extra photomask for patterning and/or implantation process. A portion of the semiconductor device 300 may be protected by a patterned photoresist layer. A portion of the N-well (drain extension well) may be exposed for forming the barrier region 320. The barrier region 320 may have an edge substantially self-aligned to an edge of the sidewall spacer at the drain side. In an embodiment, the implantation process may include a p-type dopant that includes In, $BF_2$ or B, an energy ranging from about 1 to about 60 KeV or from about 2 to about 30 KeV, a dosage ranging from about 1E13 to about 1E16 atoms/$cm^2$, and a tilt ranging from 0 to about 45 degree. The p-type barrier region may include a doping concentration ranging from about 1E19 to about 1E24 atoms/$cm^3$.

In FIG. 3D, following formation of S/D of a p-type for the p-type MOS devices in other active regions of the substrate, a process to form S/D of an n-type (N+) may be performed. The source and drain may be positioned on both sides of the gate structure and interposed thereby. The source may include an edge substantially self-aligned to one of the sidewall spacers. However, the drain may include an edge that is adjacent to the barrier region 320. Accordingly, a patterned photoresist layer may protect the barrier region that extends beyond an outer edge of the other one of the sidewall spacers 230. In the present embodiment, the source and drain regions include n-type dopant such as P or As. The source and drain may be formed by a method such as ion implantation or diffusion. A rapid thermal annealing (RTA) process may be used to activate the implanted dopant. In various embodiments, the source and drain regions may have different doping profiles formed by multi-process implantation.

Figure 3E:
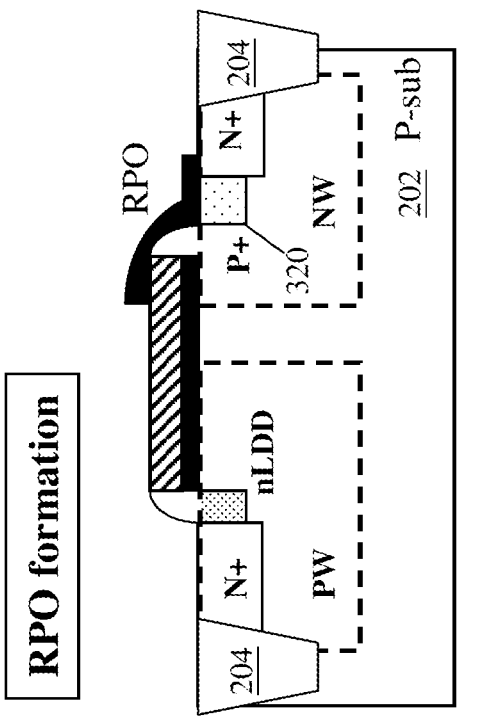

In FIG. 3E, a resist protective oxide (RPO) may be formed over a portion of the barrier region that is not protected by the sidewall spacer. The RPO may function as a silicide blocking layer during a subsequent salicide process as discussed in FIG. 2I. Thereafter, the semiconductor device 300 may undergo further CMOS processing as discussed above.

Figure 4D:
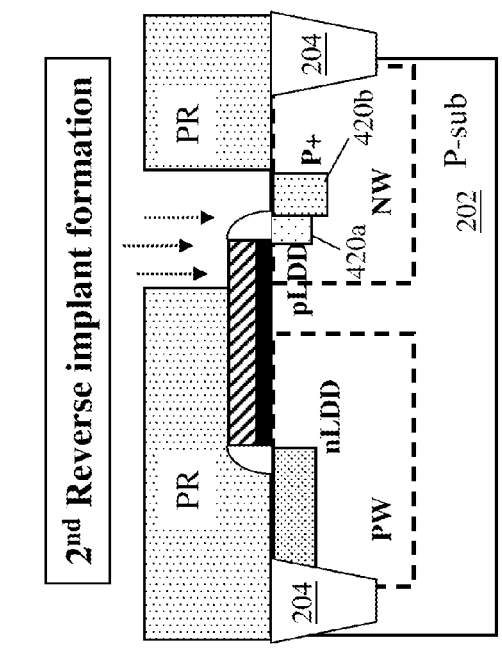

Referring to FIGS. 4A to 4F, illustrated are cross-sectional views of an alternative semiconductor device 400 accordingly to various aspects of the present disclosure. The semiconductor 400 is similar to the semiconductor device 200 of FIG. 2 except that the barrier region 420a, 420b (collectively as 420) may be formed partly during formation of lightly doped drain (LDD) region and partly during formation of the S/D. Also, the semiconductor device 400 may be fabricated with a similar method that was used to fabricate the semiconductor device 200 of FIG. 2. Accordingly, similar features in FIGS. 2 and 4 are numbered the same for the sake of clarity and simplicity. In FIG. 4A, the semiconductor device 400 is shown following the formation of the gate structure 210 as was discussed in FIGS. 2A to 2D.

In FIG. 4A, a portion 420a of a barrier region is formed in the N-well. The barrier region 420a may be formed by a counter doping or reverse implantation process (first reverse implantation). The chip of semiconductor device 400 may include it reverse type HVMOS and various NMOS and PMOS devices formed in other active regions of the substrate 202. Accordingly, the barrier region 420a may be formed locally and concurrently (same stage) with formation of lightly doped drain regions of a p-type (referred to as pLDD) in the other active regions of the substrate for the PMOS devices. Accordingly, the barrier region 420a may be formed without requiring an extra photomask for patterning and/or implantation process. A portion of the semiconductor device 400 may be protected by a patterned photoresist layer. A portion of the N-well may be exposed for forming the barrier region 420a. The barrier region 420a may have an edge substantially self-aligned to an edge of the gate structure 210. In an embodiment, the implantation process may include a p-type dopant that includes In, $BF_2$ or B, an energy ranging from about 1 to about 60 KeV or from about 2 to about 30 KeV, a dosage ranging from about 1E13 to about 1E16 atoms/$cm^2$, and a tilt ranging from 0 to about 45 degree. The p-type barrier region may include a doping concentration ranging from about 1E19 to about 1E24 atoms/$cm^3$.

In FIG. 4B, a lightly doped source region of an n-type (referred to as nLDD region) may be formed in the P-well. The nLDD region may be laterally positioned on a sidewall of the gate structure 210. As previously noted, the chip of semiconductor device 400 may include its reverse type HVMOS and various NMOS and PMOS devices formed in other active regions of the substrate 202. Accordingly, the lightly doped source region may be formed concurrently (same stage) with formation of lightly doped drain regions of an n-type (nLDD) in the other active regions of the substrate for the NMOS devices. The nLDD region may have an edge substantially self-aligned to an edge of the gate structure 210. The nLDD region may include n-type dopant such as phosphorus or arsenic. The nLDD regions are formed by a method including ion implantation or diffusion. It should be noted that the barrier region 420a including the N-well may be protected with a patterned photoresist layer during this process.

Figure 4C:
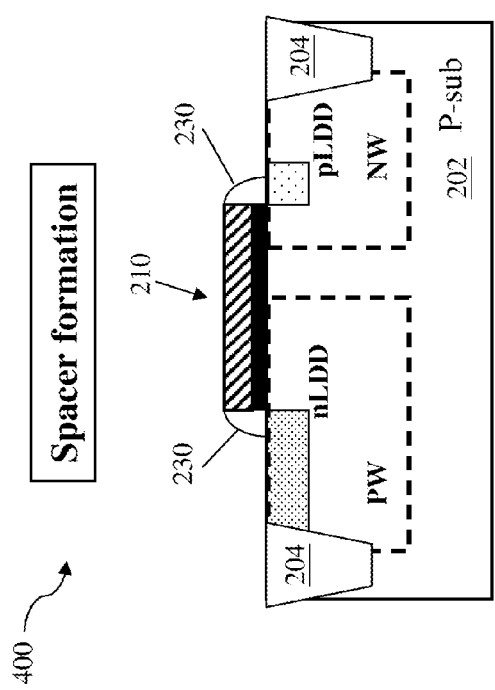

In FIG. 4C, sidewall spacers 230 may be formed on both sidewalls of the gate structure. The sidewall spacers 230 may include a dielectric material such as silicon oxide. Alternatively, the sidewall spacers 230 may optionally include silicon nitride, silicon carbide, silicon oxynitride, or combinations thereof. In some embodiments, the sidewall spacers 230 may have a multilayer structure. The sidewall spacers 230 may be formed by a deposition and etching (anisotropic etching technique) as is known in the art.

In FIG. 4D, another portion 420b of the barrier region may be formed in the N-well. The barrier region 420b may be formed by a counter doping or reverse implantation process (second reverse implantation). As previously noted, the chip of semiconductor device 400 may include its reverse type HVMOS and various NMOS and PMOS devices formed in other active regions of the substrate 202. Accordingly, the barrier region 420b may be formed locally and concurrently (same stage) with formation of source and drain (S/D) of a p-type (referred to as P+ or heavily doped region) in the other active regions of the substrate 202 for the p-type MOS devices. Accordingly, the barrier region 420b may be formed without requiring an extra photomask for patterning and/or implantation process. A portion of the semiconductor device 400 may be protected by a patterned photoresist layer. A portion of the N-well may be exposed for forming the barrier region 420b. This P+ portion of the barrier region may have an edge substantially self-aligned to the sidewall spacer. In an embodiment, the implantation process may include a p-type dopant that includes In, $BF_2$ or B, an energy ranging from about 1 to about 60 KeV or from about 2 to about 30 KeV, a dosage ranging from about 1E13 to about 1E16 atoms/$cm^2$, and a tilt ranging from 0 to about 45 degree. The p-type barrier region may include a doping concentration ranging from about 1E19 to about 1E24 atoms/$cm^3$.

In FIG. 4E, following formation of S/D of a P-type for the PMOS devices in other active regions of the substrate, a process to form S/D of an N-type (N+) may be performed for the NMOS devices. The source and drain may be positioned on both sides of the gate structure and interposed thereby. The source may include an edge substantially self-aligned to one of the sidewall spacers. However, the drain may include an edge that is adjacent to the barrier region 420. Accordingly, a patterned photoresist layer may protect a portion of the barrier region 420 that extends beyond an outer edge of the other one of the sidewall spacers 230. In the present embodiment, the source and drain regions include n-type dopant such as phosphorus or arsenic. The source and drain may be formed by a method such as ion implantation or diffusion. A rapid thermal annealing (RTA) process may be used to activate the implanted dopant. In various embodiments, the source and drain regions may have different doping profiles formed by multi-process implantation.

In FIG. 4F, a resist protective oxide (RPO) may be formed over a portion of the barrier region 420 that is not protected by the sidewall spacer. The RPO may function as a silicide blocking layer during a subsequent salicide process as discussed in FIG. 2I. Thereafter, the semiconductor device 300 may undergo further CMOS processing as discussed above.

Figure 5A:
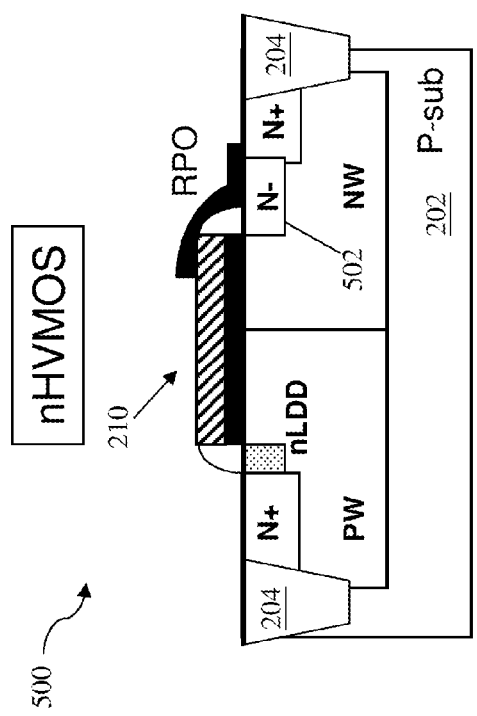

Referring to FIGS. 5A and 5B, illustrated are cross-sectional views of alternative embodiments of semiconductor devices 500, 502, according to various aspects of the present disclosure. The semiconductor device 500 is an n-type high voltage MOS device (nHVMOS). The semiconductor device 500 is similar to the semiconductor device 200 of FIG. 2 except that the barrier region 520 may be formed during a halo implant process. Accordingly, similar features in FIGS. 2 and 5A are numbered the same for the sake of clarity and simplicity. In FIG. 5A, the barrier region 520 may be formed by a counter doping or reverse implantation process (reverse implantation). The chip of semiconductor device 500 may include it reverse type HVMOS (FIG. 5B) and various NMOS and PMOS devices formed in other active regions of the substrate 202. Accordingly, the barrier region 520 may be formed locally and concurrently (same stage) with a halo implant process that is performed to tune a threshold voltage (Vt) between a standard Vt device and a high/low Vt device in other active regions of the substrate 202. Accordingly, the barrier region 520 may be formed without requiring an extra photomask for patterning and/or implantation process. A portion of the semiconductor device 500 may be protected by a patterned photoresist layer. A portion of the N-well (drain extension well) may be exposed for forming the barrier region 520. The barrier region 520 may have an edge substantially self-aligned to an edge of the gate structure 210.

It should be noted that the halo implant process utilizes a very light counter doping as compared to the counter doping when forming the p-type LDD and S/D regions disclosed above with reference to FIGS. 2-4. As such, the dosage of the halo implant process is not sufficient to change the type of conductivity of the region to p-type. In other words, the conductivity type of the barrier region 520 is the same as the N-well and the drain but the barrier region 520 has a lighter concentration (N−) than the concentration of the N-well (drain extension well) and the drain (N+). In an embodiment, the halo implant process may include a p-type dopant that includes In, $BF_2$ or B, an energy ranging from about 1 to about 60 KeV or from about 2 to about 30 KeV, a dosage ranging from about 1E10 to about 1E13 atoms/cm$^2$, and a tilt ranging from 0 to about 45 degree. The n-type barrier region 520 may include a doping concentration ranging from about 1E15 to about 1E21 atoms/cm$^3$.

In FIG. 5B, the semiconductor device 502 is a reverse type device of the semiconductor device 500. That is, the semiconductor device 502 is a p-type HVMOS (pHVMOS). To form a complementary HVMOS, the semiconductor device 502 is formed with a similar structure and configuration except that all doping types may be reversed and with an n-type buried layer (deep n-well or DNW) implanted deeply under the active region of the pHVMOS device. Similar features in FIGS. 5A and 5B are numbered the same for the sake of clarity and simplicity. The barrier region 522 may be formed by a counter doping or reverse implantation process (reverse implantation). The chip of semiconductor device 502 may include it reverse type HVMOS (FIG. 5A) and various NMOS and PMOS devices formed in other active regions of the substrate 202. Accordingly, the barrier region 522 may be formed locally and concurrently (same stage) with a halo implant process that is performed to tune a threshold voltage (Vt) between a standard Vt device and a high/low Vt device in other active regions of the substrate 202. Accordingly, the barrier region 522 may be formed without requiring an extra photomask for patterning and/or implantation process. A portion of the semiconductor device 502 may be protected by a patterned photoresist layer. A portion of the P-well (drain extension well) may be exposed for forming the barrier region 522. The barrier region 522 may have an edge substantially self-aligned to an edge of the gate structure 210.

It should be noted that the halo implant process utilizes a very light counter doping as compared to the counter doping when forming the n-type LDD and S/D regions for the other devices on the same chip. As such, the dosage of the halo implant process is not sufficient to change the type of conductivity to n-type. In other words, the conductivity type of the barrier region 522 is the same as the P-well and the drain but the barrier region 520 has a lighter concentration (P−) than the concentration of the P-well (drain extension well) and the drain (P+). In an embodiment, the halo implant process may include an n-type dopant that includes phosphorous or arsenic, an energy ranging from about 1 to about 60 KeV or from about 2 to about 30 KeV, a dosage ranging from about 1E10 to about 1E13 atoms/cm$^2$, and a tilt ranging from 0 to about 45 degree. The p-type barrier region 522 may include a doping concentration ranging from about 1E15 to about 1E21 atoms/cm$^3$.

Referring back to FIG. 2I, a table below depicts various performance characteristics that have been observed between the embodiments disclosed herein (New, with a counter doping region) and conventional high voltage devices (Old, without counter doping region), where those devices are based on advanced 45 nm technology logic device process without using extra masks and subject to product with 5 V application. As shown in the table, Ioff (off-state current) is reduced (reduced leakage) and the time dependent dielectric breakdown (TDDB) is increased (improved reliability) for the embodiments (with barrier region having reverse implantation or counter doping) disclosed herein as compared to the conventional high voltage devices.

| Technology Process | 45 nm | | | |
|---|---|---|---|---|
| Gox (A) | 55 | | | |
| Scheme | OLD | | NEW | |
| MOS | N | P | N | P |
| Lg (um) | 0.9 | 0.6 | 0.9 | 0.6 |
| W (um) | 10 | 10 | 10 | 10 |
| Ioff (pA/um) | 27.7 | 54.1 | 4.4 | 0.8 |
| TDDB (spec.: 10 yrs) | — | fail | — | pass |

Among various embodiments, the present method and structure provide an enhanced performance high voltage device that is configured as a lateral diffused MOS (LDMOS) formed in a dual-well structure (a p-type well and a n-type well) within the substrate. By implementing the barrier region (counter doping or reverse implantation), which plays a role of resurf, the surface field along the channel below the gate structure may be reduced. The DC performance of the high voltage device may be improved, particularly for critical problems such as leakage and TDDB in advance technologies (e.g., 45 nm and below). Additionally, by implementing the barrier region instead of a STI feature, hot carrier injection life time is improved. Thus, the high voltage device and method of making the same disclosed herein exhibits reduced leakage and improved reliability. Moreover, the high voltage device and method of making the same disclosed herein may be fabricated with the same process that is used to form NMOS and PMOS devices (CMOS process flow) for logic device (low voltage) without requiring additional photomask and/or other processes. Therefore, the cost for fabricating SoC that includes both high voltage and logic devices are kept low.

The disclosed structure and method may have various embodiments, modifications and variations. In one example, the semiconductor device may further include a stress layer overlying the substrate and gate features. The stress layer may comprise silicon nitride, silicon oxynitride, silicon oxide, and silicon carbide. In another embodiment, the source and drain regions may have different structures, such as raised, recessed, or strained. The high voltage device may not be limited to an n-type MOS device and can be extended to a p-type MOS device with a similar structure and configuration except that all doping types may be reversed and with a DNW buried substrate. The corresponding dimensions are modified according to the design for the desired transistor performance. Further embodiments may also include, but are not limited to, vertical diffused metal-oxide-semiconductor (VD- MOS), other types of high power MOS transistors, Fin structure field effect transistors (FinFET), and strained MOS structures.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device comprising:
   a gate structure disposed on a substrate;
   a source and a drain formed in the substrate on either side of the gate structure, the source and drain having a first type of conductivity;
   a first lightly doped region of the first type of conductivity disposed in substrate adjacent the source;
   a second lightly doped region of a second type of conductivity disposed in substrate adjacent the gate structure; and
   a doped region of the second type of conductivity disposed in substrate and extending from the second lightly doped region to the drain.

2. The semiconductor device of claim 1, further comprising:
   a first well of the first type of conductivity disposed in the substrate; and
   a second well of the second type of conductivity disposed in the substrate.

3. The semiconductor device of claim 2, wherein the first lightly doped region is disposed in the second well and the second lightly doped region is disposed in the first well.

4. The semiconductor device of claim 1, wherein the first lightly doped region is aligned with a sidewall of the gate structure.

5. The semiconductor device of claim 1, wherein the second lightly doped region is aligned with a sidewall of the gate structure.

6. The semiconductor device of claim 1, wherein an edge of the second lightly doped region interfaces with an edge of the doped region.

7. The semiconductor device of claim 1, wherein an edge of the first lightly doped region interfaces with an edge of the source.

8. A semiconductor device, comprising:
   a first well of a first type of conductivity disposed in a substrate;
   a second well of a second type of conductivity disposed in the substrate;
   a gate structure disposed on the substrate, the gate structure having a first portion overlying the first well and a second portion overlying the second well;
   a first source/drain feature of the first type of conductivity disposed in the second well;
   a first lightly doped region of the first type of conductivity disposed in the second well adjacent the gate structure;
   a second source/drain feature of the first type of conductivity disposed in the first well;
   a second lightly doped region of the first type of conductivity disposed in the first well adjacent the gate structure; and
   a doped barrier region disposed in the first well and adjacent the second source/drain feature, the barrier region being formed by doping impurities of the second type of conductivity.

9. The semiconductor device of claim 8, wherein the barrier region continuously extends in the substrate to an edge of the second source/drain feature.

10. The semiconductor device of claim 8, wherein the barrier region includes another lightly doped region of the second type of conductivity disposed in substrate adjacent the gate structure and a doped region of the second type of conductivity disposed in substrate adjacent the second source/drain feature.

11. The semiconductor device of claim 8, wherein the barrier region is directly under a sidewall spacer associated with the gate structure.

12. The semiconductor device of claim 8, wherein the barrier region is aligned with a sidewall of the gate structure.

13. The semiconductor device of claim 8, wherein the lightly doped regions are aligned with sidewalls of the gate structure.

14. A semiconductor device comprising:
   a gate structure formed on a substrate;
   a sidewall spacer formed on the gate structure;
   a first source/drain feature and a second source/drain feature formed in the substrate on either side of the gate structure, the first and second source/drain features having a first type of conductivity;
   a first lightly doped region of the first type of conductivity disposed in substrate adjacent the first source/drain feature;
   a second lightly doped region of the first type of conductivity disposed in substrate adjacent the second source/drain feature; and
   a barrier region formed in the substrate and continuously extending in the substrate to an edge of the second source/drain feature, wherein the barrier region is formed by doping a dopant of a second type of conductivity different from the first type of conductivity.

15. The semiconductor device of claim 14, wherein barrier region includes a lightly doped region of the second type of conductivity and a heavily doped region of the second type of conductivity.

16. The semiconductor device of claim 14, wherein barrier region includes a first portion having the second type of conductivity and extending to a first depth within the substrate and a second portion having the second type of conductivity and extending to a second depth within the substrate, the second depth being different than the first depth.

17. The semiconductor device of claim 14, wherein the barrier region extends in the substrate from at least an edge of the sidewall spacer.

18. The semiconductor device of claim 14, wherein the barrier region is directly under the sidewall spacer.

19. The semiconductor device of claim 14, wherein the barrier region includes a first portion having the second type of conductivity at a first concentration and a second portion having the second type of conductivity at a second concentration, wherein the first portion includes an edge that is aligned with a sidewall of the gate structure and the second portion includes an edge that is aligned with an edge of the sidewall spacer, wherein the first concentration is different than the second concentration.

20. The semiconductor device of claim 14, further comprising a resist protect oxide (RPO) formed directly over a portion of the barrier region.

* * * * *